United States Patent
Cao

(10) Patent No.: US 7,522,231 B2
(45) Date of Patent: Apr. 21, 2009

(54) FLAT DISPLAY DEVICE WITH PROTECTIVE COVER

(75) Inventor: Xiang Cao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 0 days.

(21) Appl. No.: 11/951,278

(22) Filed: Dec. 5, 2007

(65) Prior Publication Data
US 2009/0009678 A1    Jan. 8, 2009

(30) Foreign Application Priority Data
Jul. 6, 2007    (CN) ................. 2007 1 0201010

(51) Int. Cl.
G06F 1/16    (2006.01)
H05K 7/00    (2006.01)
H05K 5/00    (2006.01)

(52) U.S. Cl. .................. 349/58; 349/56; 345/905; 361/679; 361/681

(58) Field of Classification Search ............... 349/56, 349/58; 361/679, 681; 345/905; 248/917
See application file for complete search history.

(56) References Cited

U.S. PATENT DOCUMENTS

| 5,173,686 A | * | 12/1992 | Fujihara | ............... 345/87 |
| 2007/0030633 A1 | * | 2/2007 | Tseng | ............... 361/681 |

* cited by examiner

*Primary Examiner*—Brian Healy
*Assistant Examiner*—Michael P Mooney
(74) *Attorney, Agent, or Firm*—Frank R. Niranjan

(57) ABSTRACT

An exemplary flat display device includes a frame with a front panel and a plurality of buttons, a protective cover slidably mounted on the front panel to expose or shield the buttons, and a positioning member. A center window is formed in the front panel for exposing a display panel embedded in the frame. A pair of grooves is defined in the front panel adjacent opposite sides of the window respectively. A locating hole is defined in the front panel beside one of the grooves. A pair of rails is formed on a rear surface of the protective cover to be slidably received in the grooves of the frame and a notch is defined in the rear surface of protective cover as well. The positioning member is resiliently received in the locating hole and releasably snapped into the notch.

15 Claims, 7 Drawing Sheets

FLAT DISPLAY DEVICE WITH PROTECTIVE COVER

BACKGROUND

1. Field of the Invention

The present invention relates to flat display devices, and more particularly to a flat display device having a protective device.

2. Description of Related Art

Generally, for dustproof and radiation protection, a protective cover is mounted on the front panel of a flat display device. Traditionally, some buttons are disposed on the front surface of the flat display device. For conveniently operating the buttons, currently the protective cover is smaller than the front panel of the flat display device to expose the buttons. However, the flat display device with the smaller protective cover appears unaesthetic.

What is desired, therefore, is a flat display device having a protective cover which allows convenient operation of buttons disposed on the front surface thereof as well as enhancing aesthetics of the flat display device.

SUMMARY

An exemplary flat display device includes a frame with a front panel, a protective cover slidably mounted on the front panel to expose or shield the buttons, and a positioning member. A center window is formed in the front panel for exposing a display panel embedded in the frame. A pair of grooves is defined in the front panel adjacent opposite sides of the window respectively. A locating hole is defined in the front panel beside one of the grooves. A pair of rails is formed on a rear surface of the protective cover to be slidably received in the grooves of the frame and a notch is defined in the rear surface of protective cover as well. The positioning member is resiliently received in the locating hole and releasably snapped into the notch.

Other advantages and novel features of the present invention will become more apparent from the following detailed description of embodiment when taken in conjunction with the accompanying drawings, in which:

DETAILED DESCRIPTION

Figure 1:
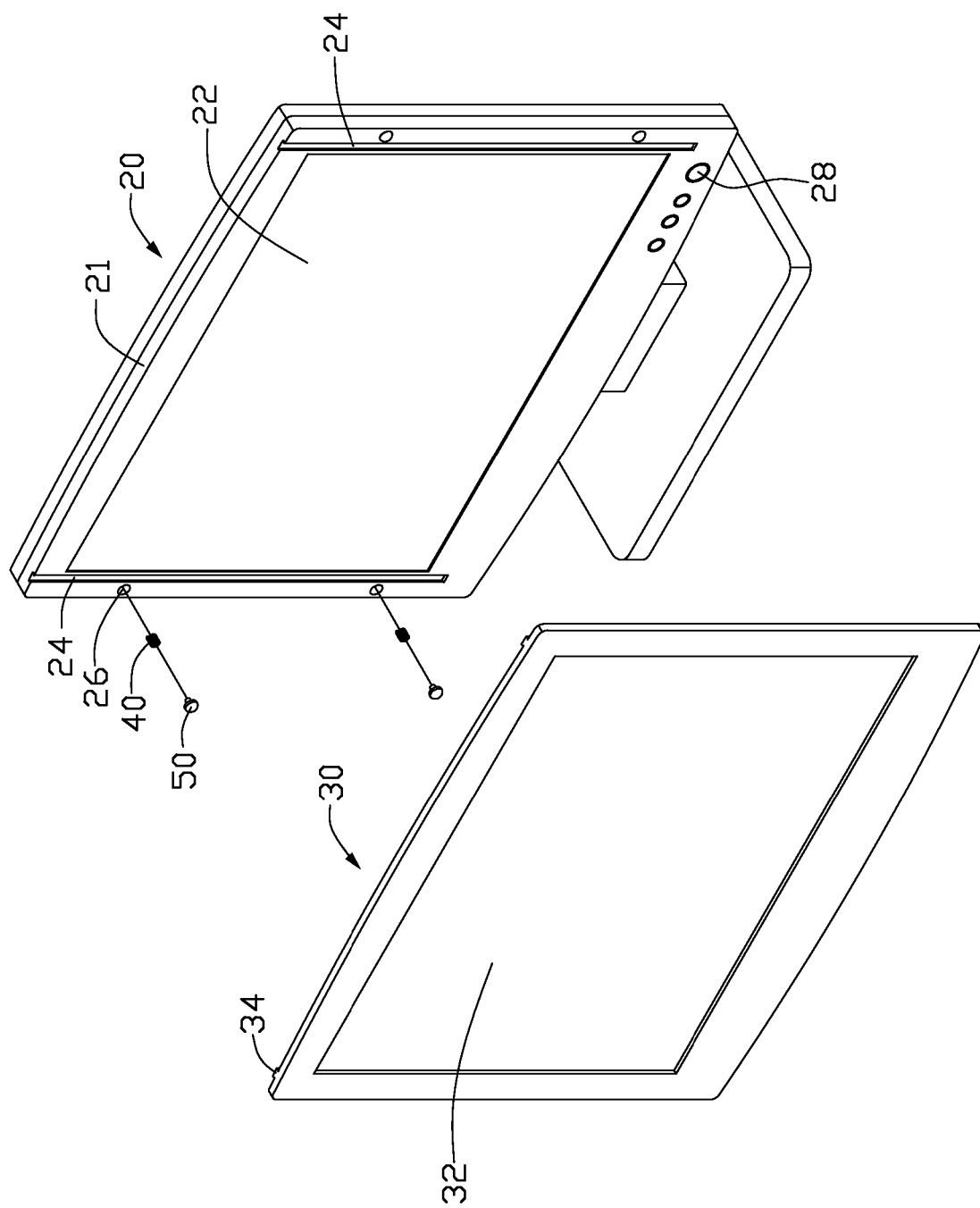
FIG. 1 is an exploded, isometric view of a flat display device in accordance with an embodiment of the present invention, the flat display device including a protective cover.

Referring to FIG. 1, a flat display device in accordance with an embodiment of the present invention includes a frame 20, a protective cover 30, a plurality of resilient members 40, and a plurality of positioning members 50.

Figure 2:
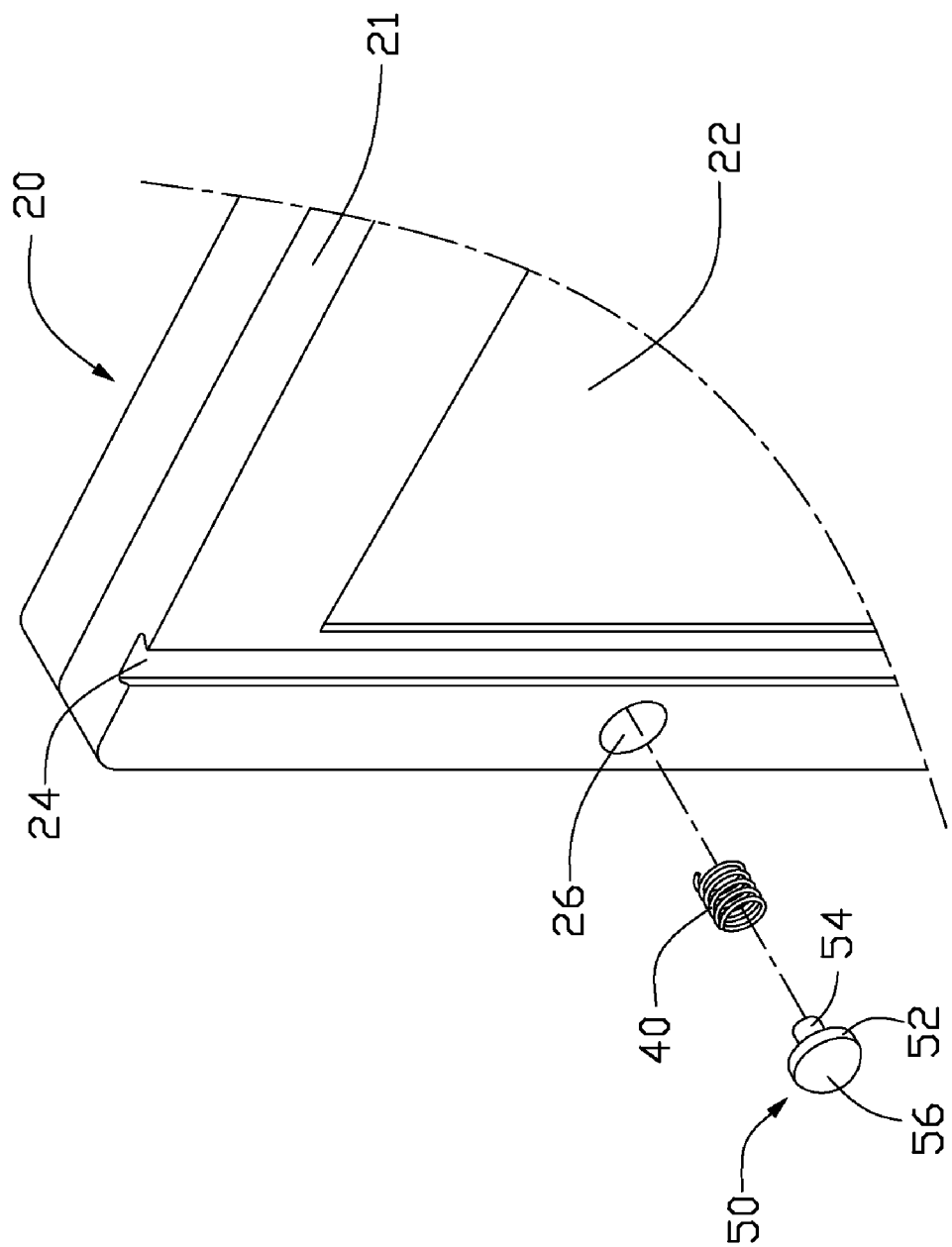
FIG. 2 is an enlarged view of an upper left portion of the flat display device shown in FIG. 1.

Referring also to FIG. 2, the frame 20 includes a front panel 21 defining a center window 22 to expose a display panel installed in the frame 20. A pair of parallel grooves 24 is vertically defined in the front panel 21 opposite lateral sides of the window 22. Each groove 24 is trapezoidal in cross section. Each groove 24 has an open end communicating with a top edge of the front panel 21, and a stopping end adjacent to bottom edge of the front panel 21 A plurality of locating holes 26 is defined in the front panel 21 beside the grooves 24 respectively. A plurality of buttons 28 is disposed on the front panel 21 below the window 22. The buttons 28 can be control buttons for the flat display device.

Figure 3:
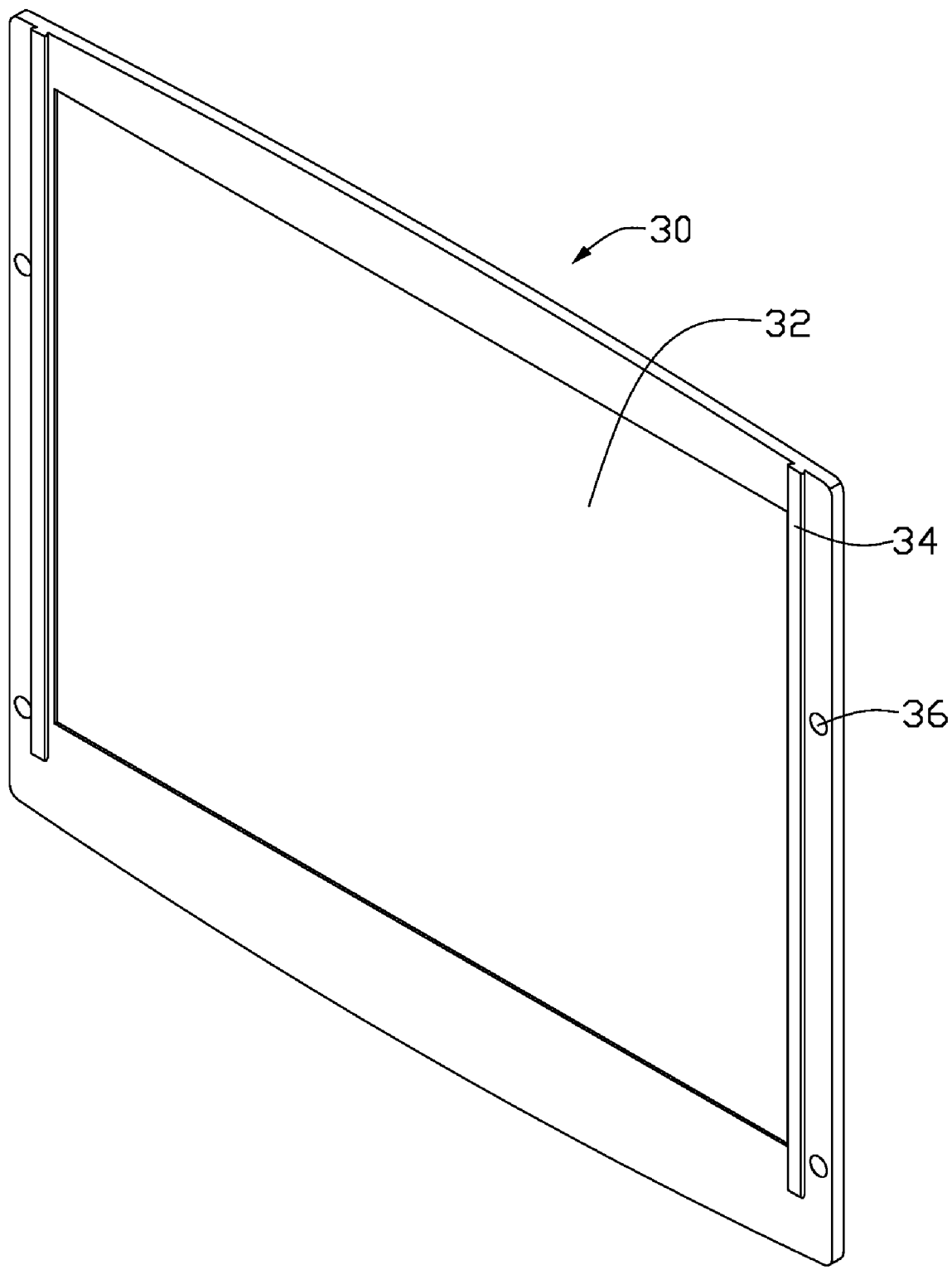
FIG. 3 is an isometric view of the protective cover of FIG. 1.

Referring also to FIG. 3, the protective cover 30 includes a transparent screen 32 corresponding to the window 22 of the front panel 21. A pair of rails 34 is respectively formed on the rear surface of the protective cover 30 at opposite sides of the transparent screen 32 corresponding to the grooves 24 of the frame 20. A plurality of notches 36 each having a concave hemispherical surface are defined in the rear surface of the protective cover 30 and are configured to correspond to the locating holes 26 of the frame 20 when the protective cover 30 is moved to a predetermined position. Each rail 34 is trapezoidal in cross section to slidably mate with the grooves 24 of frame 20.

In this embodiment, the resilient members 40 are coil springs.

Each positioning member 50 includes a domed cap 52, and a shank 54 extending from the cap 52. A bulge 56 forms the domed top of the cap 52 for engaging in the corresponding notch 36 of the protective cover 30 and for resisting against perpendicular force applied thereto causing the positioning member 50 to resiliently retract into a corresponding locating hole 26. Each resilient member 40 is placed around the shank 54 of the corresponding positioning member 50, and received in the corresponding locating hole 26 and abutting against the cap 52. The diameter of the cap 52 of each positioning member 50 is slightly less than that of the corresponding locating hole 26.

Figure 4:
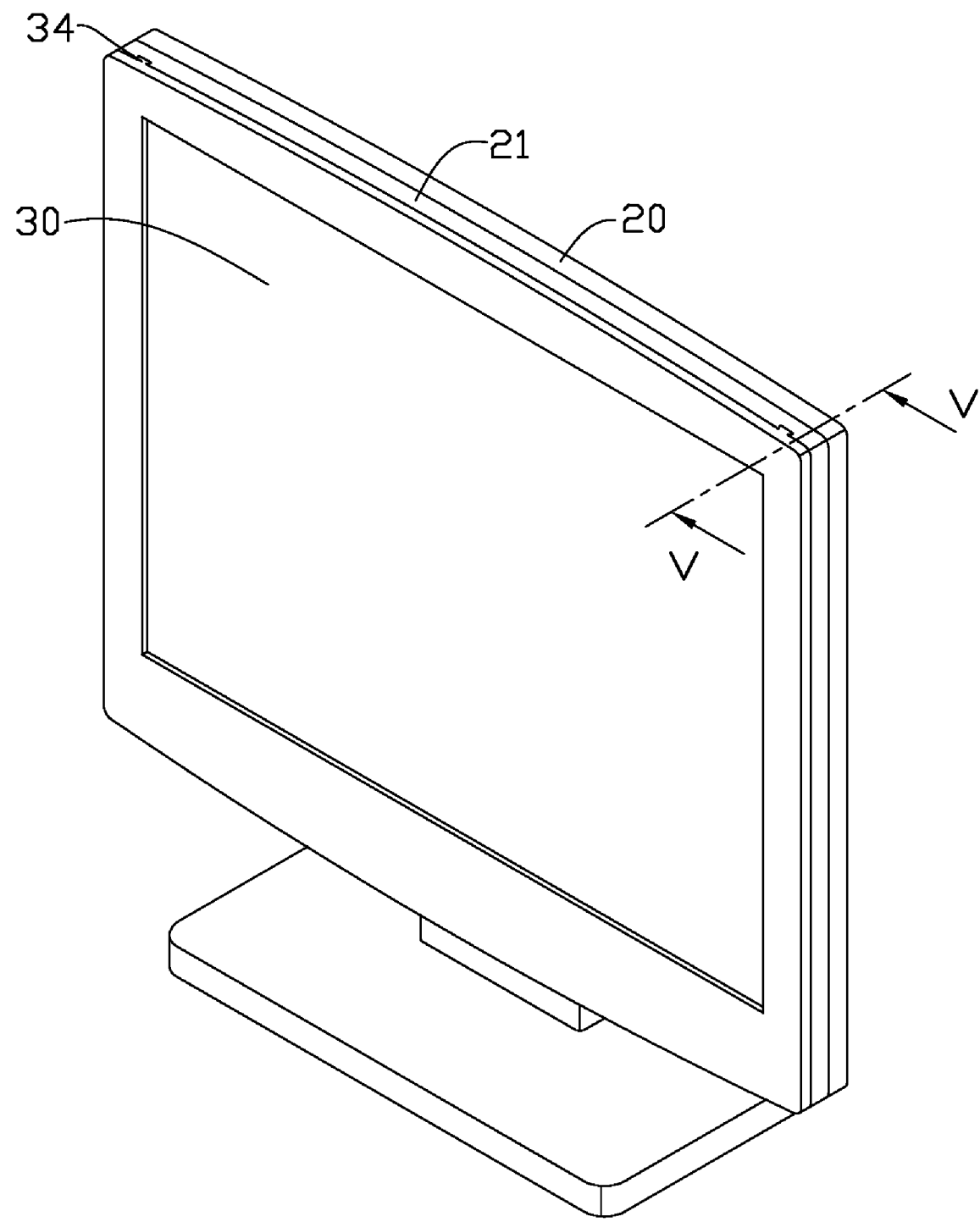
FIG. 4 is an assembled view of FIG. 1.
Figure 5:
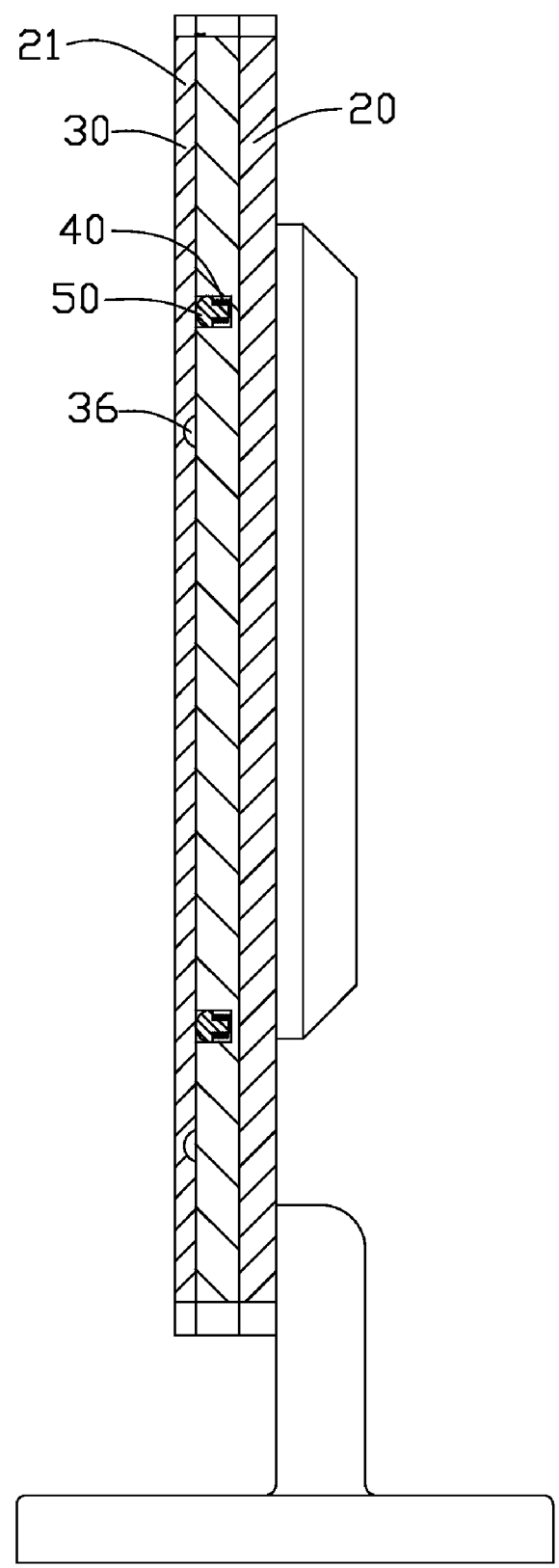
FIG. 5 is a sectional view taken along line V-V of FIG. 4.

Referring also to FIG. 4 and FIG. 5, in assembly, the positioning members 50 with the corresponding resilient members 40 are movably received in the corresponding locating holes 26 of the front panel 21 while the caps 52 of the positioning members 50 remain outside of the corresponding locating holes 26. Opposite ends of each resilient member 40 respectively abut against the cap 52 of the corresponding positioning member 50 and the bottom of the corresponding locating hole 26. The rails 34 of the protective cover 30 are respectively slid into the corresponding grooves 24 of the front panel 21 from the open end thereof. As the protective cover 30 is slid down over the front panel 21, the caps 52 of the positioning members 50 are pressed by the cover 30 into the corresponding locating holes 26 thus compressing the corresponding resilient members 40. When the rails 34 are completely received in the grooves 24, the cover 30 is in the closed position and the buttons 28 are shielded.

Figure 6:
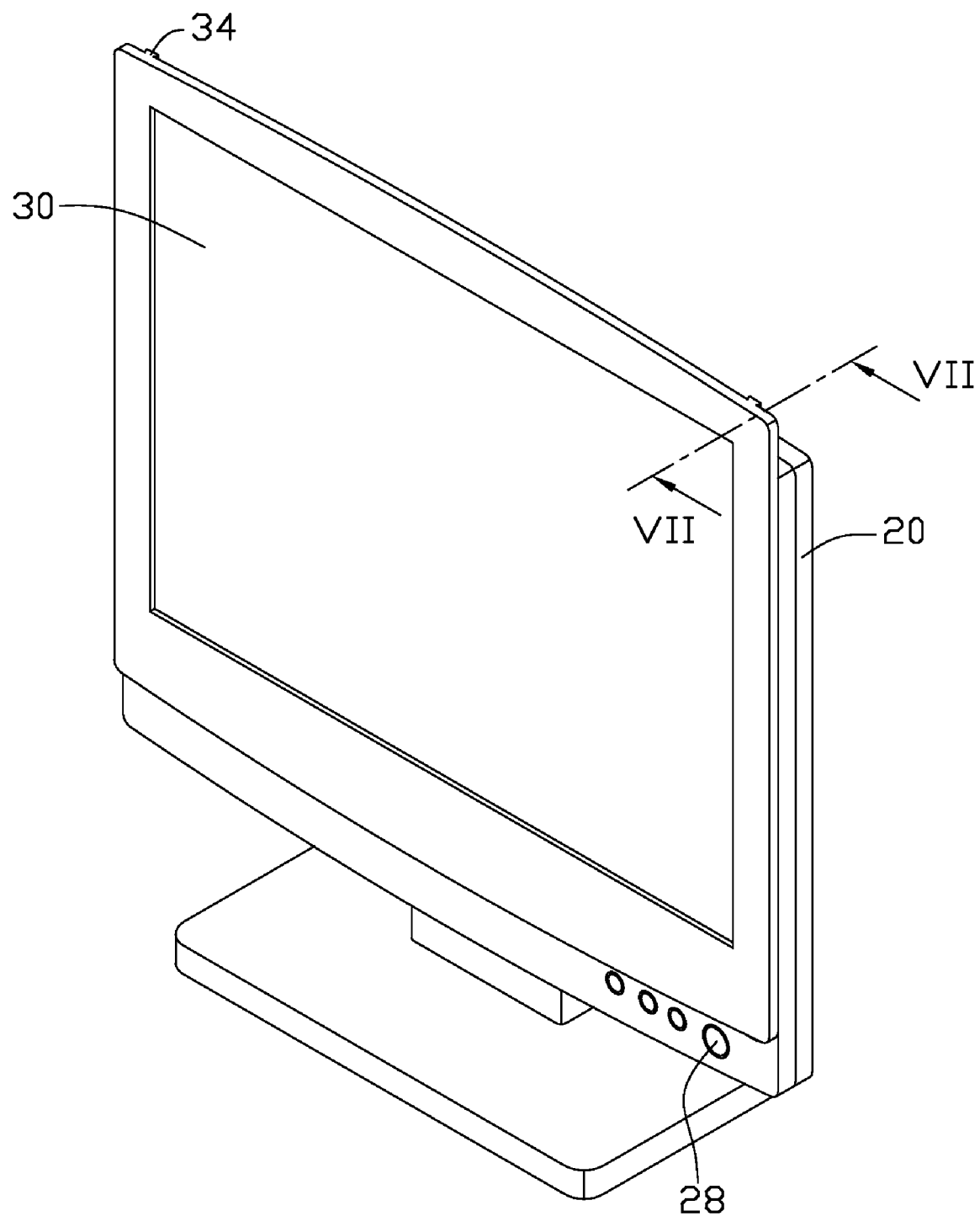
FIG. 6 is another assembled view of FIG. 1.
Figure 7:
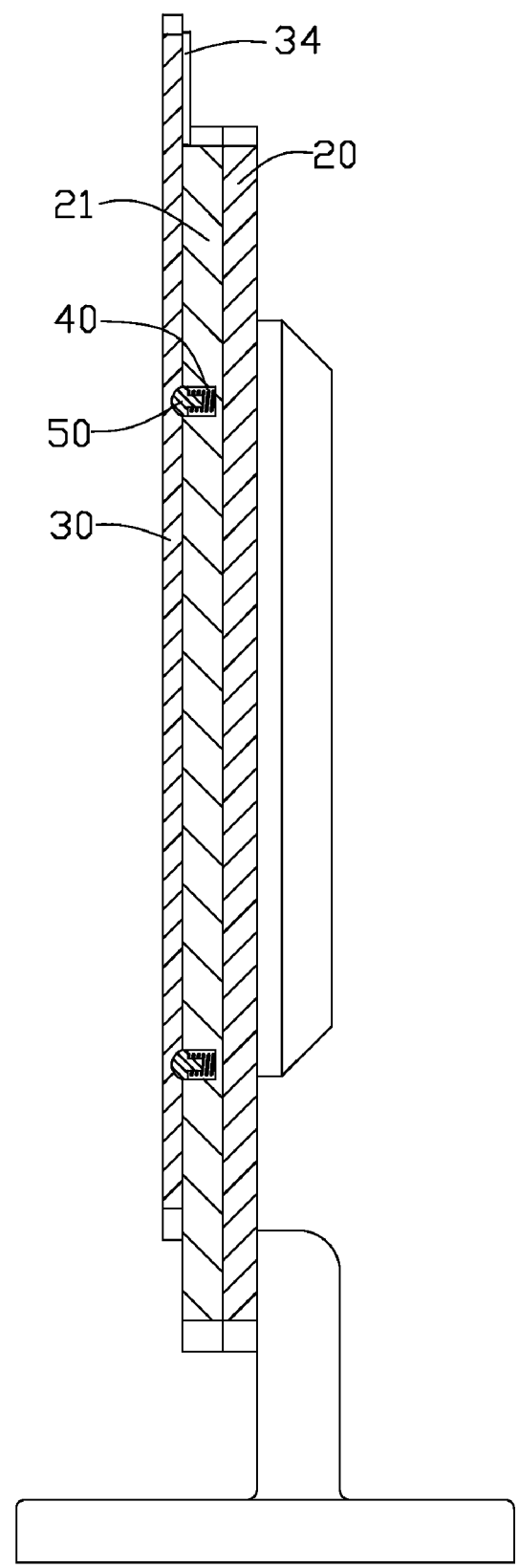
FIG. 7 is a sectional view taken along line VII-VII of FIG. 6.

Referring also to FIGS. 6 and 7, when access to the buttons 28 is desired, the protective cover 30 is slid up to expose the buttons 28 until the notches 36 of the protective cover 30 are aligned with the corresponding locating holes 26 of the front panel 21. At which time, the positioning members 50 are urged to extend by the resilient members 40 causing the bulges 56 of the members 50 to snappingly engage in the corresponding notches 36. Thus, the protective cover 30 is in an open position on the front panel 21 thereof. When it is desired to shield the buttons 28 again or remove the cover 30 from the front panel, a force applied manually to slide the cover 30 up or down will act against the curved form of the bulges 56 and cause the members 50 to retract into the locating holes 26.

In another embodiment, the buttons 28 may be disposed on other places of the front panel 21. Correspondingly, the protective cover 30 is movable in other directions to expose the buttons 28.

Alternatively, the rails 34 may be disposed on the front panel 21 of the frame 20, while the grooves 24 are correspondingly defined in the protective cover 30. The notches 36 may be defined in the front panel 21 of the frame 20, while the locating holes 26 are correspondingly defined in the protective cover 30.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A flat display device comprising:
   a frame comprising a front panel with a plurality of buttons disposed thereon, a center window configured for exposing a display panel embedded therein, a pair of grooves defined in the front panel adjacent opposite sides of the window respectively, and a locating hole defined in the front panel beside one of the grooves;
   a protective cover slidably mounted on the front panel to expose or shield the buttons, the protective cover forming a pair of rails to be slidably received in the grooves of the frame and defining a notch in a rear surface thereof;
   a positioning member resiliently received in the locating hole and releasably snapped into the notch.

2. The flat display device as described in claim 1, wherein a resilient member is arranged between the locating hole and the positioning member.

3. The flat display device as described in claim 2, wherein the resilient member is a coil spring, the positioning member comprises a cap configured for resisting against one end of the resilient member, and a shank extending from the cap and configured for extending through the resilient member.

4. The flat display device as described in claim 3, wherein a bulge is formed at one end of the cap thereof and is configured for engaging with the notch.

5. The flat display device as described in claim 4, wherein the bulge is hemispherical.

6. The flat display device as described in claim 1, wherein each groove has an open end communicating with one edge of the front panel, and a stopping end adjacent to another edge of the front panel opposite to said one edge.

7. The flat display device as described in claim 6, wherein each groove is trapezoidal in cross section.

8. The flat display device as described in claim 6, wherein the notch is defined in the rear surface of the protective cover and beside one of the rails thereof, the locating hole is correspondingly defined beside the one of the grooves.

9. A flat display device comprising:
   a frame comprising a front panel having a plurality of functional buttons disposed thereon;
   a display panel embedded in the frame;
   a protective cover having a transparent screen in the middle thereof corresponding to the display panel, the protective cover slidably mounted on the front panel to expose or shield the buttons;
   a sliding mechanism comprising a pair of grooves defined in one of the front panel and the protective cover, and a pair of rails disposed on the other one of the front panel and the protective cover for sliding in the corresponding grooves; and
   a positioning mechanism comprising at least one notch defined in one of the protective cover and front panel, and a resilient positioning member arranged on the other one of the protective cover and the front panel and releasably snappingly received in the notch.

10. The flat display device as described in claim 9, wherein the front panel further comprises a window defined in the central portion thereof for exposing the display panel, the protective cover further comprises a transparent screen formed at the central portion of the protective cover for allowing viewing of the display panel therethrough.

11. The flat display device as described in claim 10, wherein the grooves are defined in the front panel adjacent opposite sides of the window respectively, the rails are correspondingly disposed on a rear surface of the protective cover adjacent opposite sides of screen.

12. The flat display device as described in claim 1, wherein the positioning member is arranged on the front panel beside one of the grooves, the notch is correspondingly defined in the rear surface of the protective cover.

13. The flat display device as described in claim 9, wherein the said positioning member further comprises an engaging portion snappingly received in the notch and a resilient portion connecting with front panel of the frame.

14. The flat display device as described in claim 9, wherein each groove is open at one edge of the front panel, and closed adjacent to another edge of the front panel opposite to said one edge.

15. The flat display device as described in claim 9, wherein the grooves and the corresponding rails are trapezoidal in cross section.

* * * * *